United States Patent [19]

Kakumu

[11] Patent Number: 5,300,462
[45] Date of Patent: Apr. 5, 1994

[54] METHOD FOR FORMING A SPUTTERED METAL FILM

[75] Inventor: Masakazu Kakumu, Mountain View, Calif.

[73] Assignee: Kabushiki Kaisha Toshiba, Japan

[21] Appl. No.: 910,458

[22] Filed: Jul. 8, 1992

Related U.S. Application Data

[62] Division of Ser. No. 480,919, Feb. 16, 1990.

[30] Foreign Application Priority Data

Feb. 20, 1989 [JP] Japan ................................ 1-39820

[51] Int. Cl.⁵ ............... H01L 21/465; H01L 21/324; C23C 14/34
[52] U.S. Cl. ................................... 437/245; 437/247; 437/931; 204/192.11; 204/192.25; 148/DIG. 105
[58] Field of Search ............ 437/199, 197, 198, 187, 437/247, 931, 245; 204/192.25, 192.11, 192.17; 148/DIG. 26, DIG. 105, DIG. 106, DIG. 83

[56] References Cited

U.S. PATENT DOCUMENTS

| 3,871,067 | 3/1975 | Bogardus et al. ............ 29/571 |
| 3,887,994 | 6/1975 | Ku et al. ...................... 29/571 |
| 4,333,226 | 6/1982 | Abe et al. .................... 29/576 |
| 4,382,826 | 5/1983 | Pfleiderer et al. ........... 437/931 X |
| 4,385,947 | 5/1983 | Halfacre et al. ............. 437/197 X |

FOREIGN PATENT DOCUMENTS

| 54-101663 | 8/1970 | Japan. |
| 59-4058 | 1/1984 | Japan. |
| 59-113645 | 6/1984 | Japan. |
| 62-18023 | 1/1987 | Japan. |
| 63-9952 | 1/1988 | Japan. |
| 63-122245 | 5/1988 | Japan. |
| 63-291435 | 11/1988 | Japan. |
| 1-238043 | 9/1989 | Japan. |

Primary Examiner—John S. Maples
Attorney, Agent, or Firm—Banner, Birch, McKie & Beckett

[57] ABSTRACT

A method is disclosed for alloying a sputtered metal film by forming a sputtered metal film of first metal atoms over a semiconductor substrate through a first mask and implanting a first impurity of second metal atoms into the sputtered film. Then a second mask having at least one window is formed on the sputtered film by removing said first mask and a second impurity of third metal atoms is then implanted. The substrate and film are then heat treated to form a first alloy area in which the first metal atoms and the second metal atoms are mixed and a second alloy area in which the first metal atoms and the third metal atoms are mixed.

18 Claims, 17 Drawing Sheets

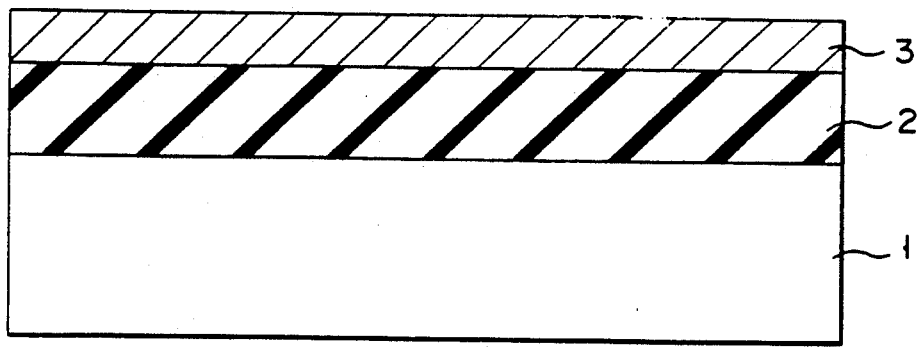
F I G. 1A
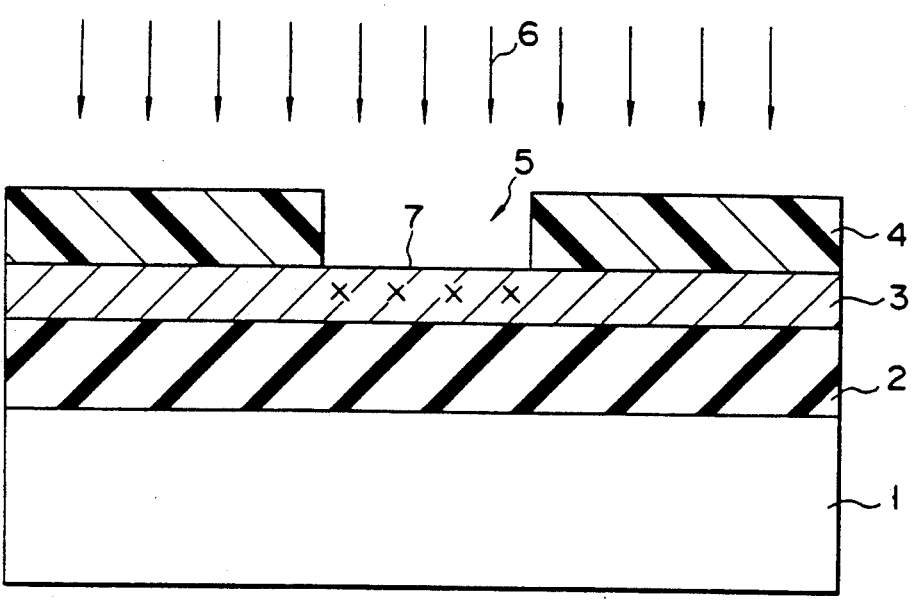
F I G. 1B
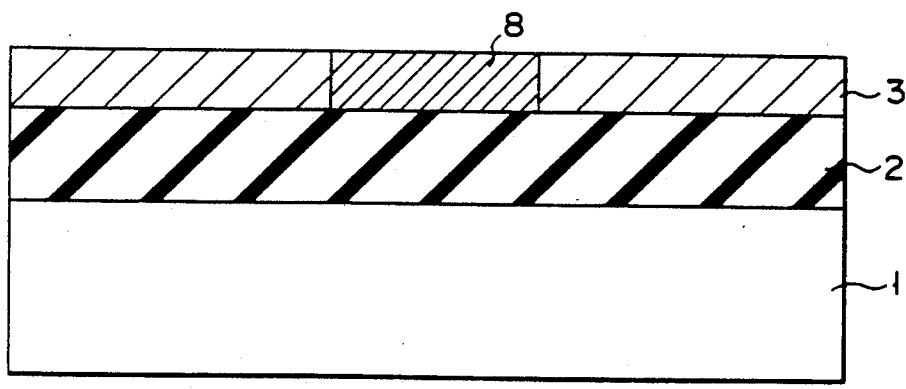
F I G. 1C

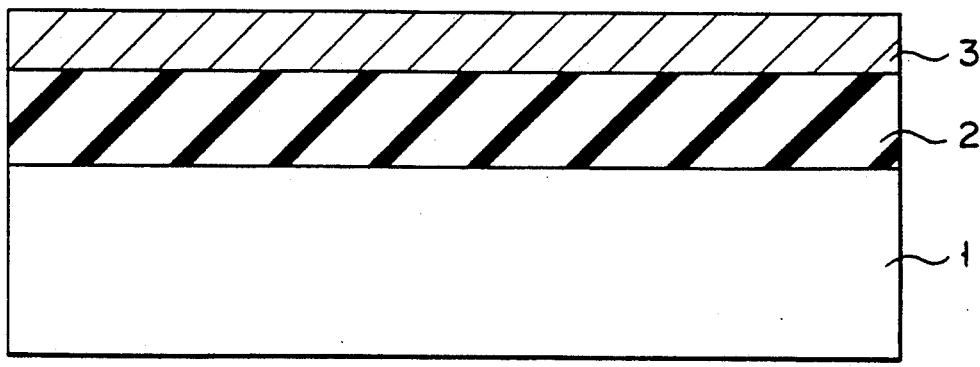
F I G. 2A
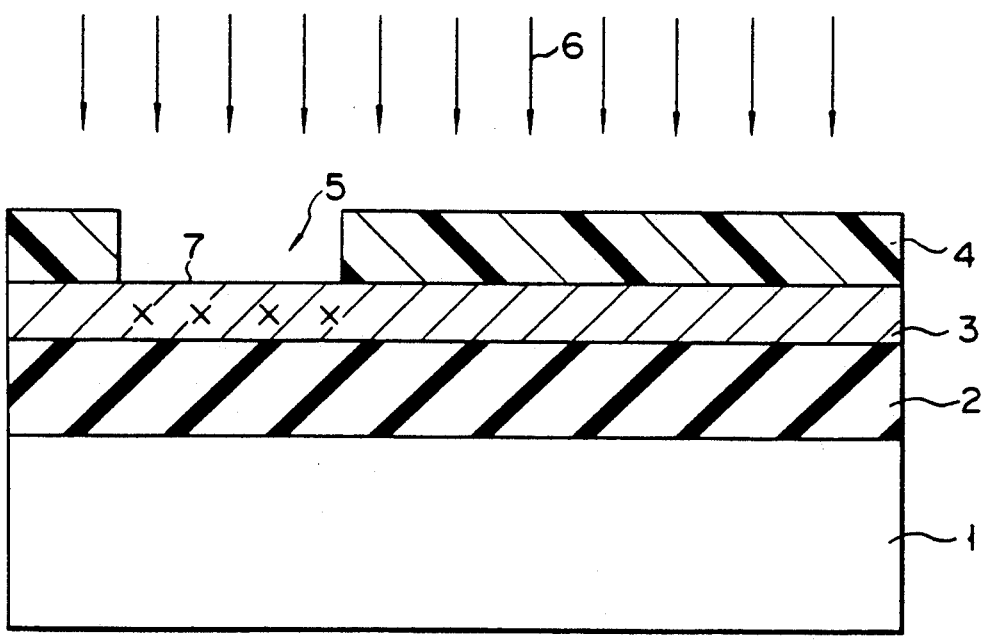
F I G. 2B

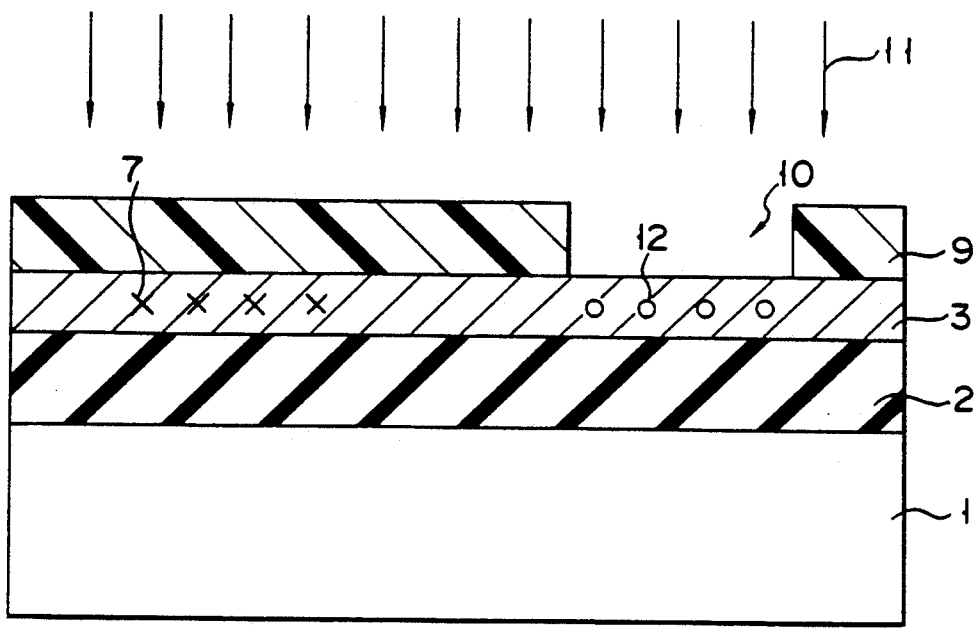
F I G. 2C
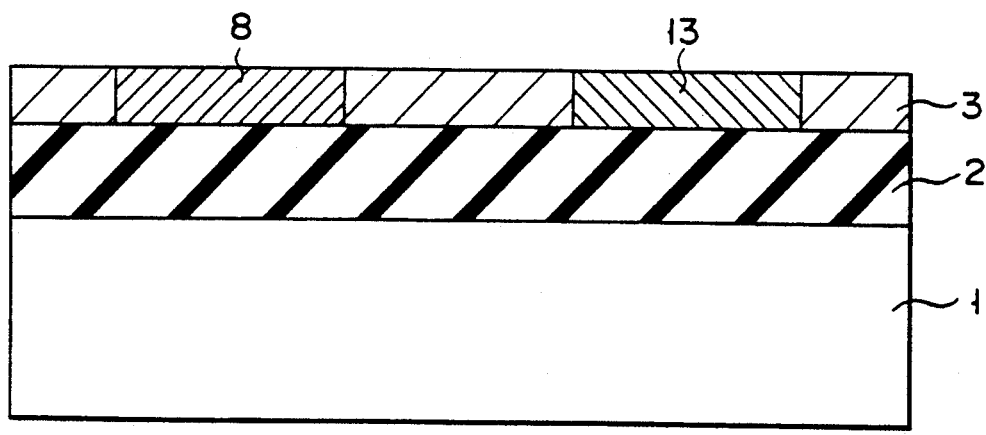
F I G. 2D

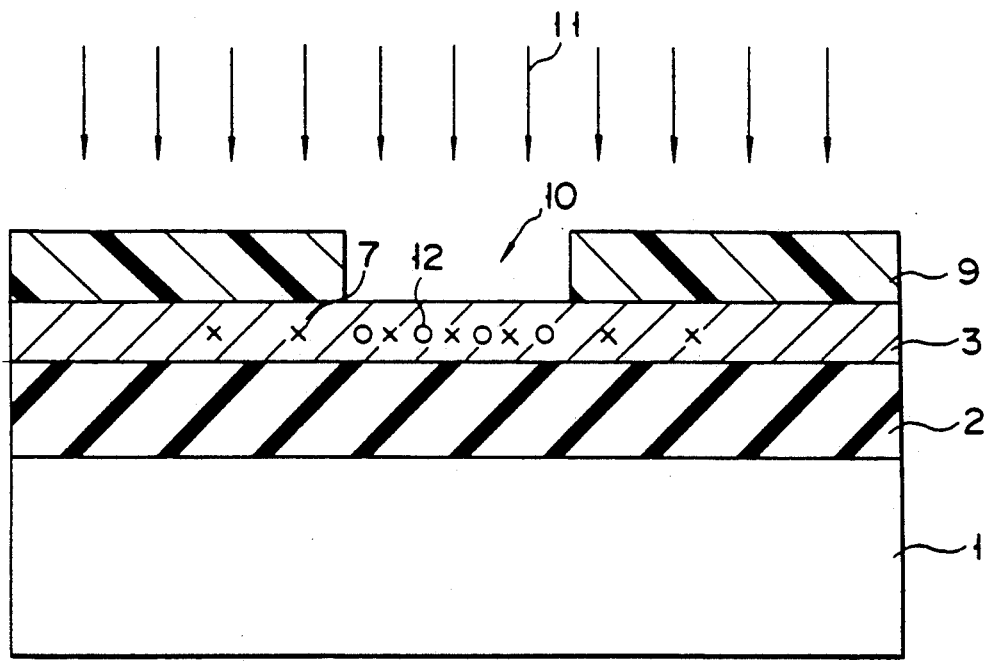
F I G. 3C
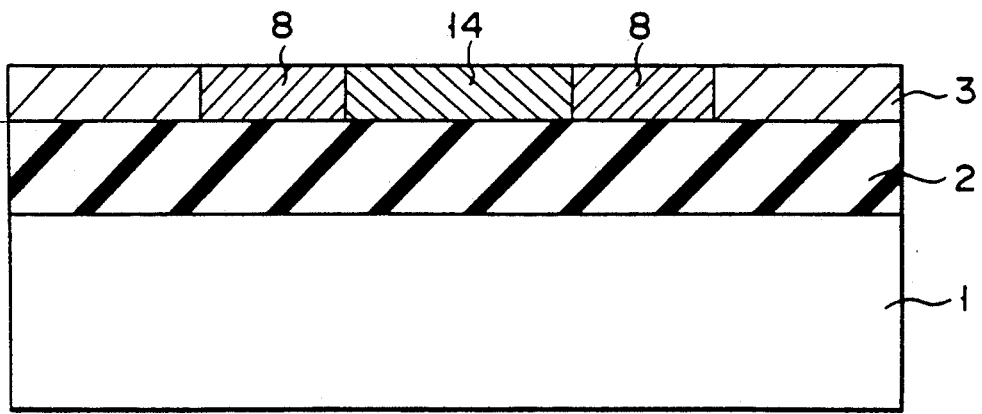
F I G. 3D

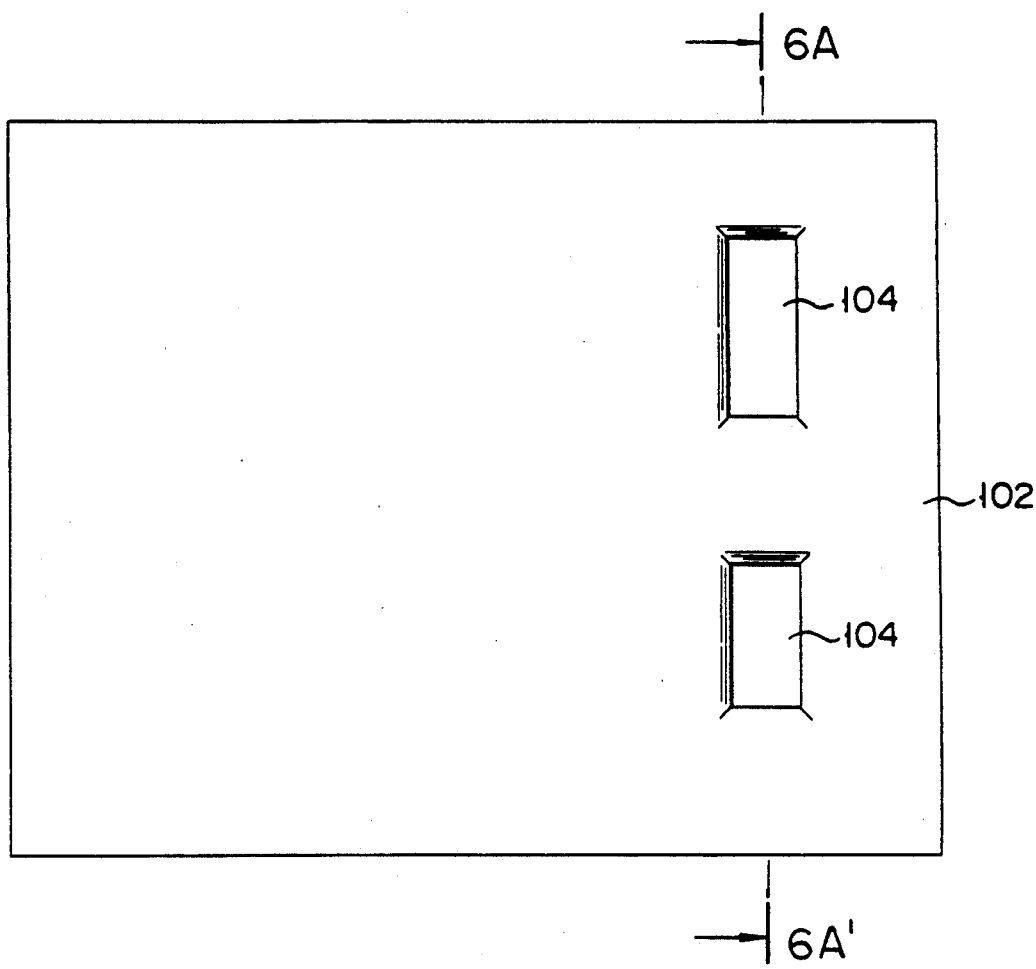
F I G. 5A
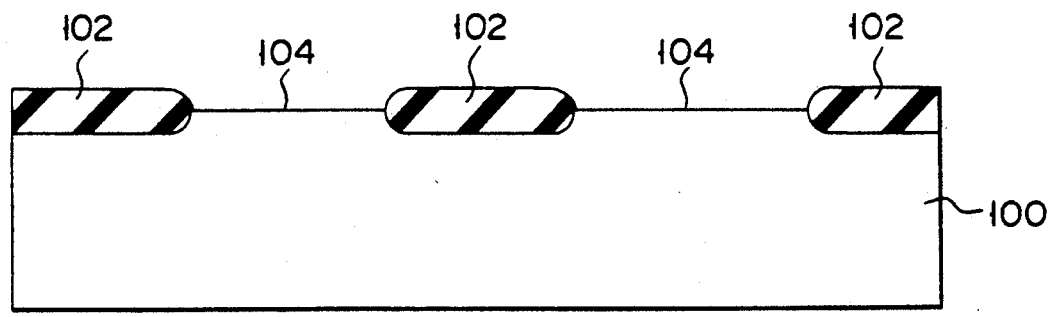
F I G. 6A

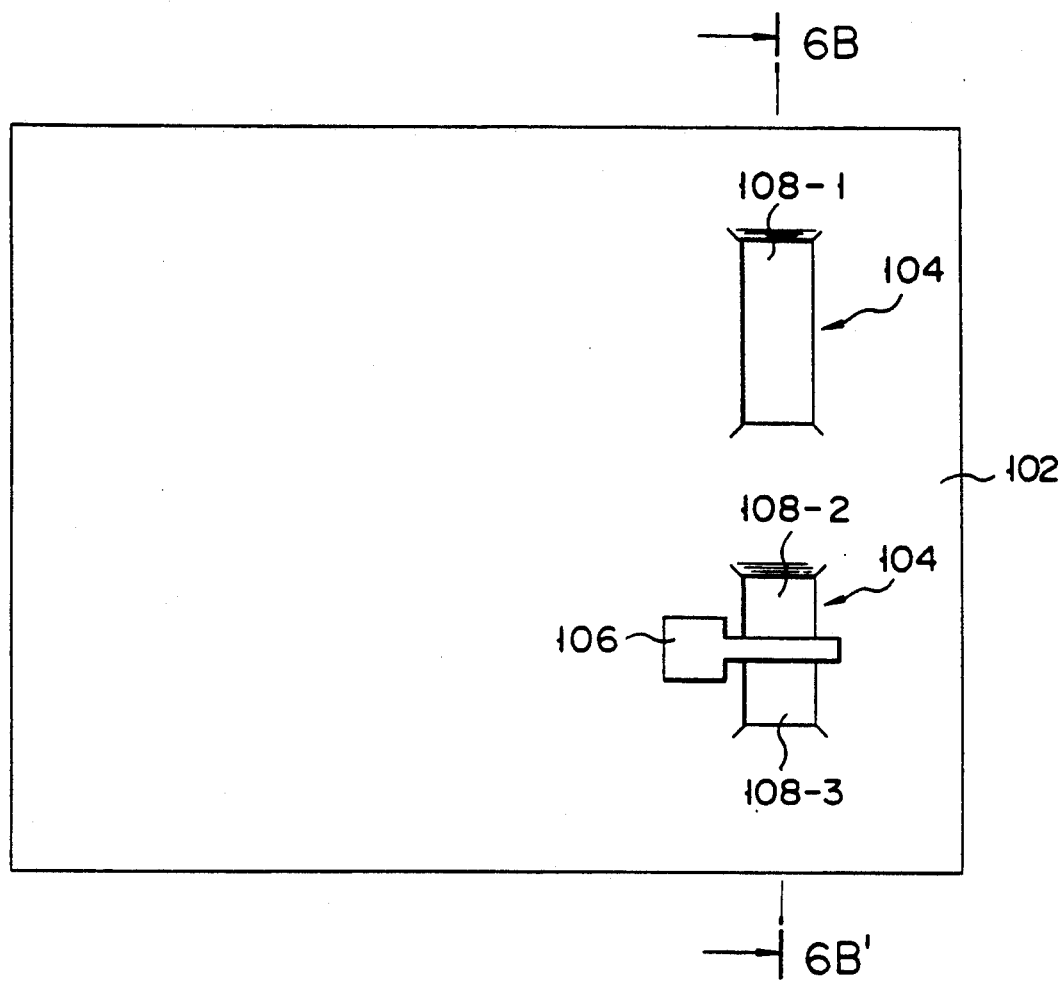
F I G. 5B
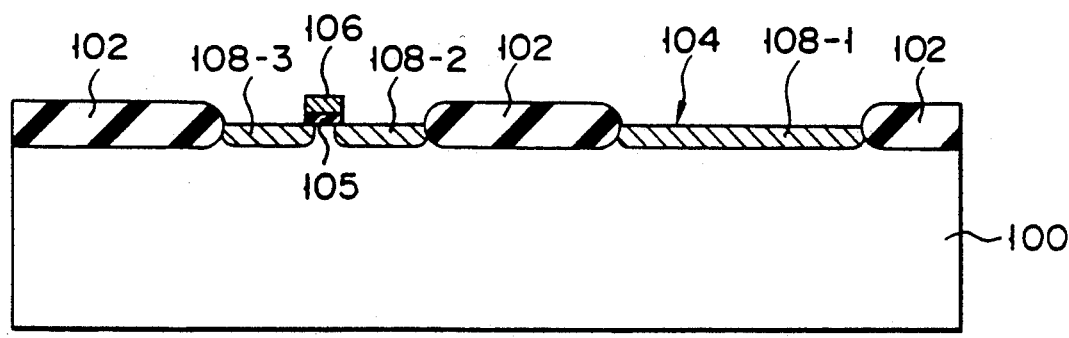
F I G. 6B

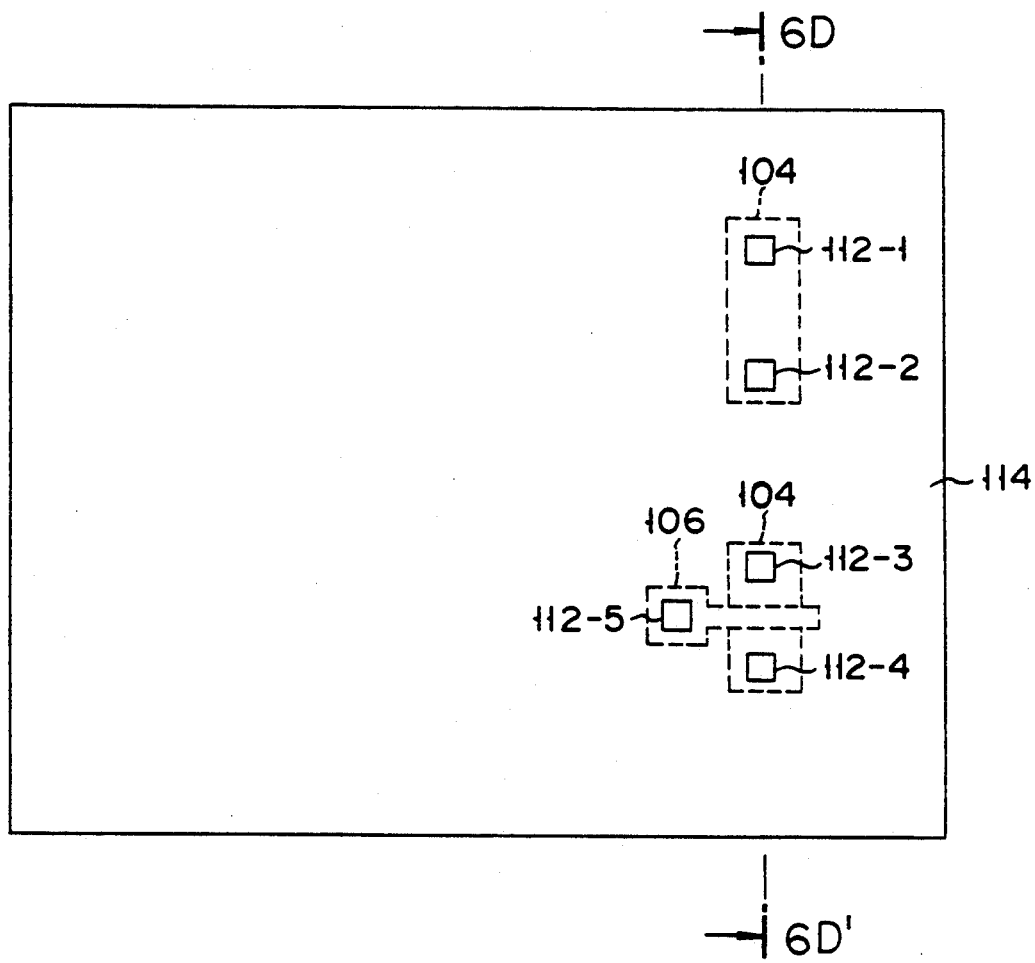
F I G. 5D
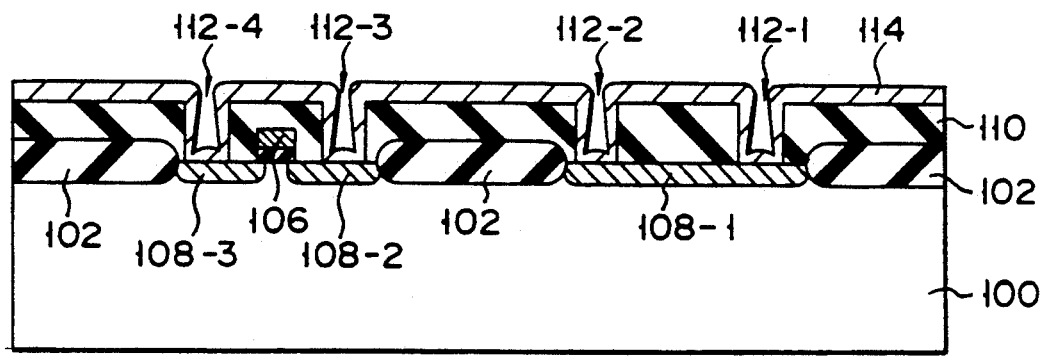
F I G. 6D

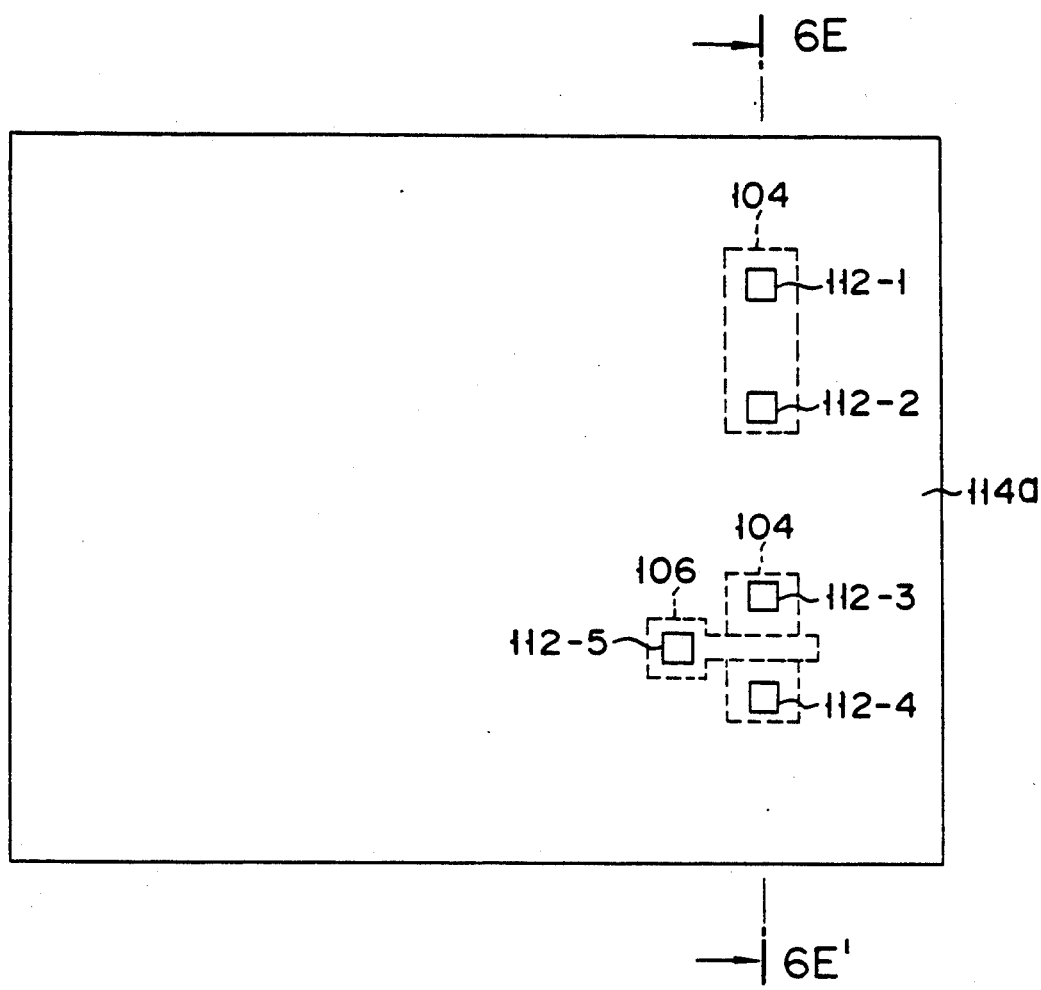
F I G. 5E
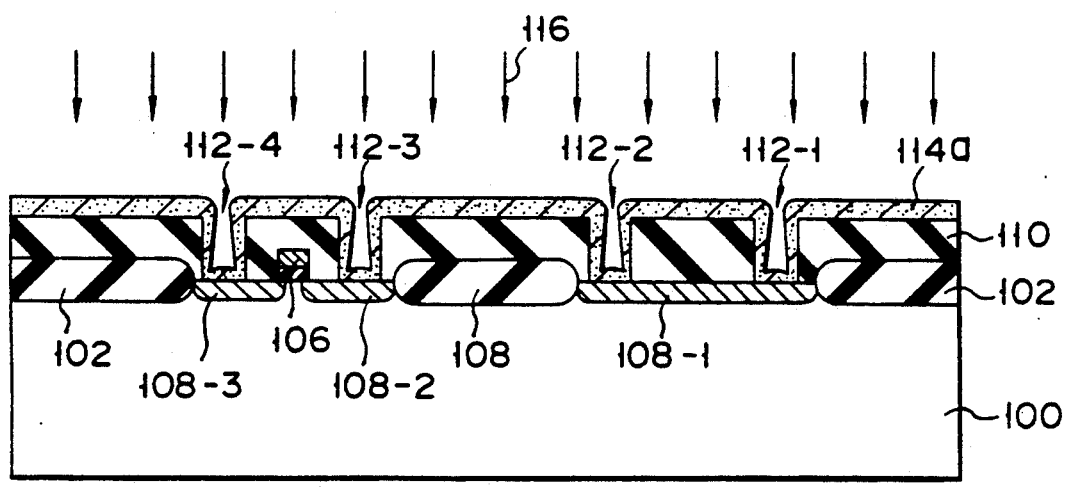
F I G. 6E

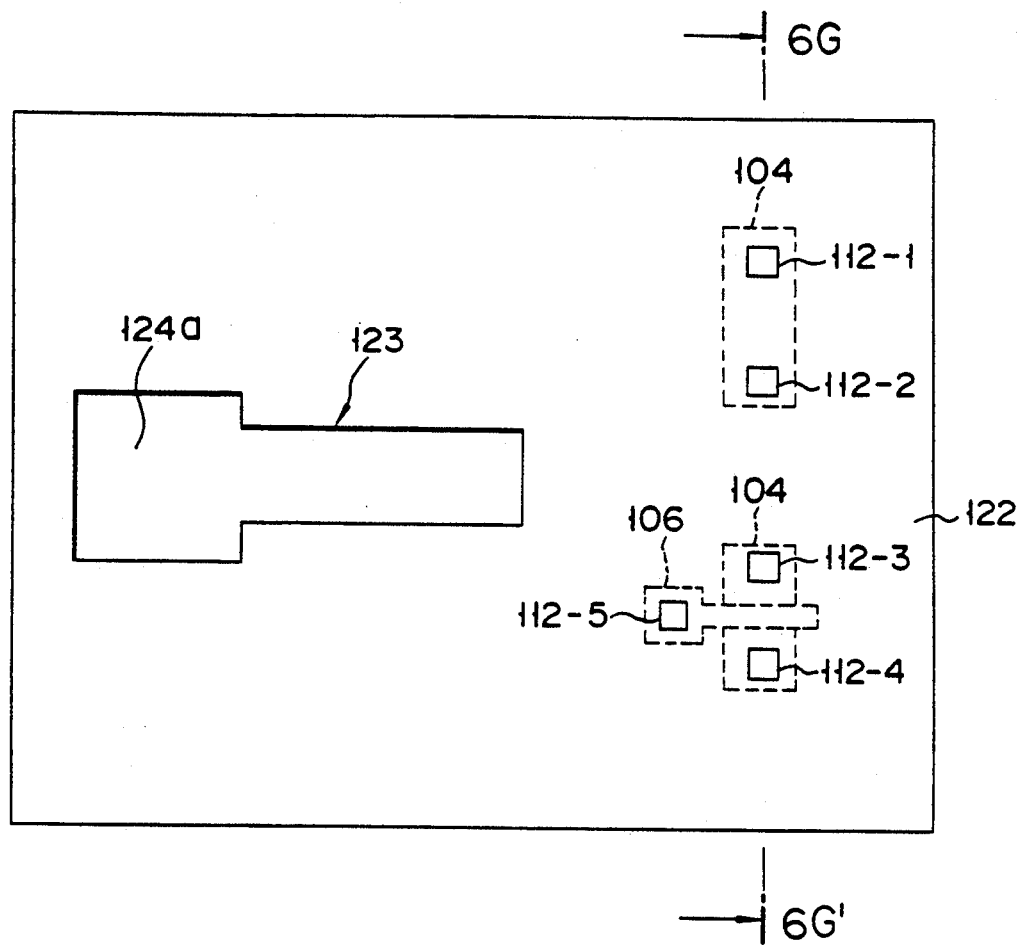
F I G. 5G
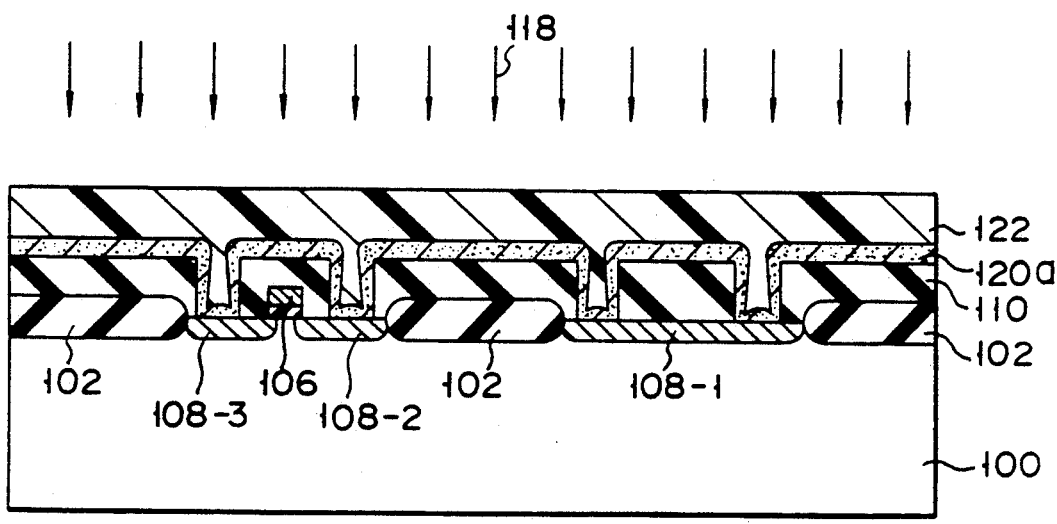
F I G. 6G

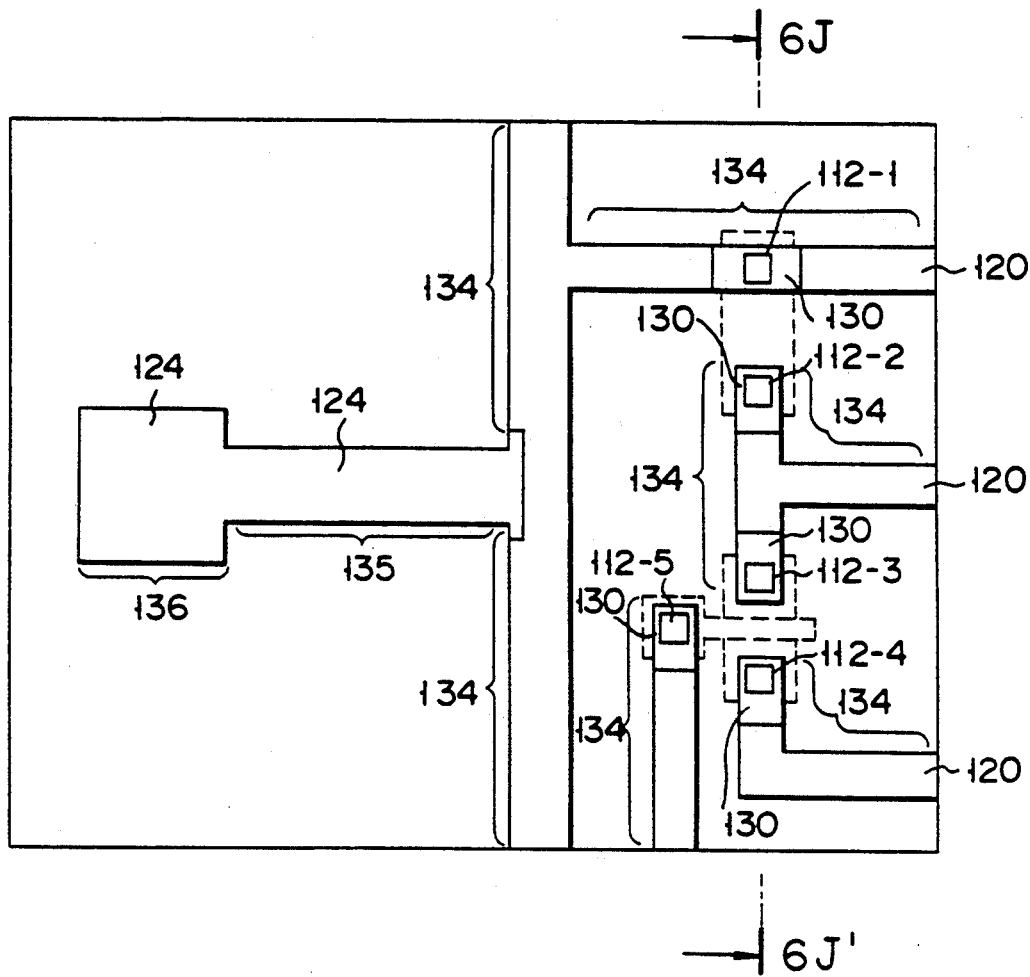
F I G. 5J
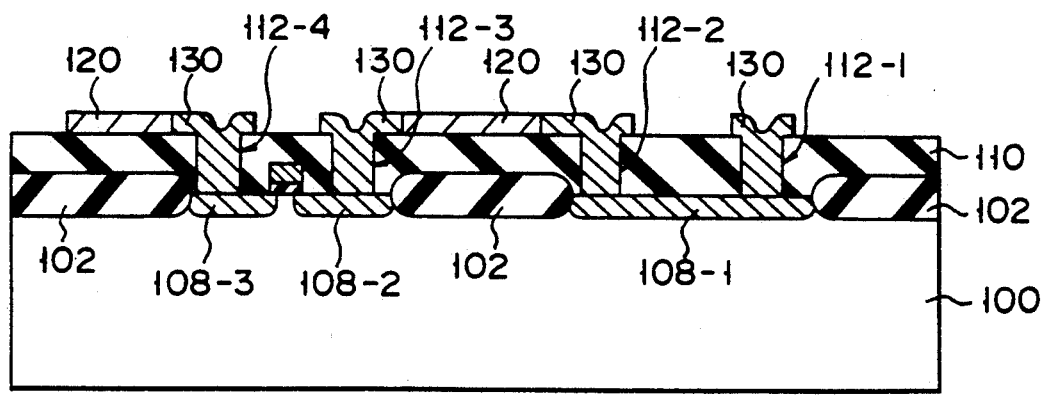
F I G. 6J

METHOD FOR FORMING A SPUTTERED METAL FILM

This application is a division of application Ser. No. 07/480,919, filed Feb. 16, 1990 which is now abandoned.

BACKGROUND OF THE INVENTION

Field of the Invention

The present invention relates to a method for forming a sputtered metal film.

Description of the Related Art

At the present time, an aluminum film has mainly been used as a metal wire for element connection in an LSI. The aluminum film is evaporated by a sputtering method on a semiconductor substrate where elements are formed. The metal film obtained by the sputtering method is hereinafter referred to simply as a sputtered metal wire.

A recent trend is toward an enhanced microminiaturization of elements in an LSI and a consequent micromiaturization is made for metal wires to be formed in the LSI. However, a problem prominently arises in connection with a stress or electromigration induced during the microfabrication of elements in the LSI.

A solution to this problem is to form an alloyed aluminum film as the metal wire so that the properties of the aluminum film may vary favorably. The current method, by which such an alloyed film is obtained, employs an alloy target containing several % of an impurity as a sputtering target for a connection metal. As one example, such alloy target contains aluminum as a principal component, a few % of copper and a few % of silicon. The alloy target is sputtered on the semiconductor substrate to obtain a sputtered metal film (aluminum alloy film). The sputtered metal film (aluminum alloy film) is patterned by a photoetching method to obtain a predetermined wiring pattern. In the aluminum alloy wire thus formed, the electromigration can be eliminated, to some extent, due to the action of the copper in the aluminum alloy film. Further, an "aluminum spike" at a contacting portion between the sputtered metal film (aluminum alloy film) and the semiconductor silicon can be prevented by the action of the silicon in the aluminum alloy film.

However, a few points still remains to be solved.

For example, the copper and silicon are not uniformly contained in the sputtered metal film (aluminum alloy film). This is probably because an amount of material to be sputtered as well as an amount of material to be deposited on the substrate varies from a material to a material used as the target material. That is, for the alloy target, it is not possible to form a uniformly sputtered metal film (aluminum alloy film). Sometimes, the copper and silicon may be deposited in crystal form in the metal wire obtained or in the contacting area between the metal wire and the substrate.

A nonuniform aluminum alloy wire, if being formed over the substrate surface, causes a lowered reliability such as an increased resistance and a ready fragility, mechanical or electrical. In particular, the mechanically fragile structure is presumably subject to stress. The electrical defect is probably caused from the aforementioned electromigration.

The sputtered metal film may also be formed in polycrystalline form, because this probably occurs due to a temperature rise in the target to be sputtered and a consequent temperature rise in that semiconductor substrate portion located opposite to the target. As well known in the art, the polycrystalline metal is poor to form as a microfabricated one and, as a result, much has at present not been expected to form a sputtered film as a microfabricated one.

Further, the sputtered metal film is formed over the substrate surface all at a time. For the sputtered metal film, it is not possible to change its nature partially.

SUMMARY OF THE INVENTION

It is a first object of the present invention to provide a method for forming a sputtered metal film which is excellent as a microfabrication one and uniform in nature and changes that nature partially.

A second object of the present invention is to provide a method for forming a wire, less subject to stress and electromigration, using that sputtered metal film which is obtained according to the first object of the present invention.

According to one aspect of the present invention, there is provided a method for forming a sputtered metal film comprising the steps of:
(a) forming a sputtered metal film over a whole surface of a semiconductor substrate with the use of a high impurity metal target;
(b) ion-implanting at least one kind of material into the sputtered metal film; and
(c) subjecting the ion-implanted metal film to heat treatment. It is thus possible to obtain a uniform, sputtered metal film as an excellent microfabricated one.

According to another aspect of the present invention there is provided a method for forming a wiring of a semiconductor device, comprising the steps of:
(a) forming a first insulating film on a semiconductor substrate of first conductivity type;
(b) forming a first opening, in the first insulating film, which leads to a surface area of the semiconductor substrate;
(c) doping an impurity of second conductivity type into the surface area of the semiconductor substrate through the first opening to form a semiconductor region;
(d) forming a second insulating film over a whole surface of a resultant structure;
(e) forming a second opening, in the second insulating film, which leads to the semiconductor region;
(f) forming a sputtered metal film over a whole surface of the resultant structure with the use of a high-purity metal target;
(g) ion-implanting one of kinds of materials as a first material into a whole surface area of the sputtered metal film;
(h) ion-implanting another kind of material as a second material into only the second opening and its neighboring sputtered metal film;
(i) patterning the sputtered metal film ion-implanted with the first and second materials to provide a predetermined wiring pattern; and
(j) subjecting the patterned sputtered metal film to heat treatment.

It is thus possible to obtain a wiring of a semiconductor device as a microfabricated one which is less affected by a stress and electromigration and ensures a high reliability.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1C are cross-sectional views showing a first method for forming a sputtered metal film according to the present invention;

FIGS. 2A to 2D are cross-sectional views showing a second method for forming a sputtered metal film according to the present invention;

FIGS. 3A to 3D are cross-sectional views showing a third method for forming a sputtered metal film according to the present invention;

FIGS. 5A to 5J, each, are a plan view showing the steps of forming a wiring of a semiconductor device which employs a sputtered metal film of the present invention; and FIGS. 6A to 6J are cross-sectional views as taken along line 6A—6A' to 6J—6J' of FIGS. 5A to 5J, respectively.

DETAILED DESCRIPTION OF THE PREFERRED EMBODIMENTS

Figure 3A:
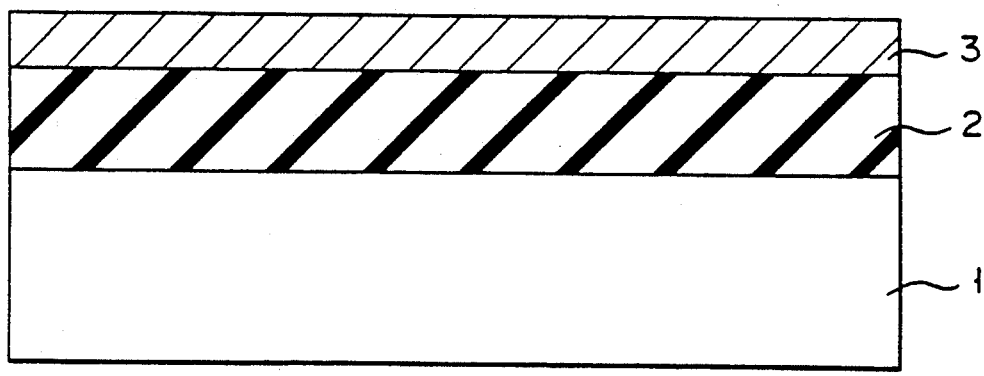

The embodiments of the present invention will be explained below with reference to the accompanying drawings.

Embodiment 1

A method for forming a sputtered metal film according to the present invention will be explained below with reference to FIGS. 1A to 1C.

FIGS. 1A to 1C are cross-sectional views for forming a sputtered metal film over a semiconductor substrate.

First, as shown in FIG. 1A, an insulating film such as a silicon oxide film 2 is formed over the surface of a P type silicon substrate 1 whose specific resistance is, for example, 1 to 2 $\Omega$cm. An aluminum film 3 of, for example, about 0.4 $\mu$m in thickness is formed over the surface of the resultant substrate by a sputtering method using a high-purity aluminum target.

Then a photoresist 4 is coated on the surface of the resultant structure as shown in FIG. 1B. A predetermined opening 5 is formed in the photoresist by a photoetching method. With the photoresist 4 as a mask, an impurity 6 is ion-implanted selectively into the aluminum film 3. A site thus ion implanted with the impurity 6 is indicated by reference numeral 7 in FIG. 1B.

The impurity to be added in this way is, for example, titanium.

A heat treatment step is carried out subsequent to removing the photoresist 4 as shown in FIG. 1C. In this way, the implanted impurity such as titanium 7 is activated in the aluminum film 3 to selectively provide an aluminum/titanium alloy film B. Since the titanium is precipitated at its crystal boundaries with the aluminum in the aluminum/titanium alloy film 8, hillocks resulting from the electromigration are hard to form in the aluminum/titanium alloy film. Thus the aluminum/titanium alloy film 8 is less affected by the electromigration.

In order to obtain an aluminum/titanium alloy film less affected by the electromigration, a sputtering step has so far been carried out using an aluminum/titanium alloy target.

The aluminum/titanium alloy film thus obtained is not uniform with the titanium precipitated in crystal form.

Further, an aluminum alloy film, being formed over the substrate surface by the sputtering method using not only the aluminum/titanium alloy but also the aluminum alloy target, is all the same in the properties. The reason is that the aluminum alloy film is formed all at a time over the surface of the substrate. A typical example of inconvenience when silicon is used as the impurity is an increased connection resistance in the aluminum alloy wiring.

The aluminum/silicon alloy film can advantageously prevent an "aluminum spike" at the contacting area between the aluminum and the silicon (semiconductor). However, the aluminum/silicon alloy film possesses a high resistance and hence the aluminum alloy wiring thus formed has an increased connection resistance. For the aluminum alloy target it is difficult to control a percentage of the impurity. The reason is that, upon the manufacture of an aluminum alloy target, a predetermined molten impurity is mixed with a molten aluminum within a crucible.

According to the present invention, a sputtered metal film (alloy) is obtained by forming a sputtered metal film over a substrate, ion-implanting a predetermined impurity into the sputtered metal film and subjecting the resultant film to heat treatment.

The aluminum alloy film as shown in FIG. 1C, being thus formed by the aforementioned method, possesses a uniform property with an implanted impurity not precipitated in crystal form. As a result, the aluminum alloy film 8 has an enhanced resistance to electromigration and is less affected by stress involved and high in mechanical strength.

According to the present invention, if the aforementioned impurity is selectively ion-implanted into the aluminum film by a specified method represented by the photoetching method, the aluminum film 3 can be alloyed selectively, that is, locally.

That is, a sputtered metal film (aluminum film 3) is formed as a single layer including a local area of a different nature.

Since the aforementioned impurity is ion-implanted into the aluminum film 3, it is possible to control the percentage of the impurity by, for example, varying a dosage of the impurity. This control can be done readily with high accuracy.

As evident from the above, according to the present invention, a sputtered metal film can be formed, as an alloyed film, over the substrate by essentially forming a sputtered metal film over the substrate and ion-implanting a predetermined impurity into the metal film. A conventional alloy target may be employed as a sputtering target for the present invention. It is, however , desirable to use a high-purity metal target as a sputtering target for the present invention.

Embodiment 2

A method of forming a sputtered metal film according to a second embodiment of the present invention will be explained below with reference to FIGS. 2A to 2D.

FIGS. 2A to 2D are cross-sectional views showing the steps of forming a sputtered metal film over a semiconductor substrate. In FIGS. 2A to 2D, the same reference numerals are employed to designate a portion or a location corresponding to that shown in FIGS. 1A to 1C.

The steps shown in FIGS. 2A and 2B are the same as those shown in FIGS. 1A and 1B.

In the second embodiment, for example, titanium is used as an impurity 6.

As shown in FIG. 2C, subsequent to the removal of a photoresist 4, a photoresist 9 is coated over the surface of a semiconductor substrate. Then a predetermined opening 10 is formed in the photoresist by a photoetching step and, with the photoresist as a mask, an impurity 11 is selectively ion-implanted into an aluminum film 3. A site ion-implanted with the impurity 11 is indicated by reference numeral 12 in FIG. 2C.

In the second embodiment, the impurity 11 is, for example, silicon.

Then a heat treatment step is carried out subsequent to removing the photoresist as shown in FIG. 2D. By so doing, the impurities titanium and silicon are activated in the aluminum film 3 to selectively form an aluminum/titanium alloy film 8 and aluminum/silicon 13 in the aluminum film 3 as shown in FIG. 2D.

In this way, at least one kind of an impurity is separately ion-implanted into the aluminum film 3.

Embodiment 3

A method for forming a sputtered metal film according to a third embodiment of the present invention will be explained below with reference to FIGS. 3A to 3D.

FIGS. 3A to 3D are cross-sectional views showing the steps of forming a sputtered metal film over the surface of a semiconductor substrate. In FIGS. 3A to 3D, reference numerals are employed to designate a portion or a location corresponding to that shown in FIGS. 2A to 2D.

The steps 3A and 3B are the same as shown in FIGS. 1A and 1B and no further explanation is omitted for brevity's sake.

For example, titanium is employed as the impurity 6.

Figure 3B:
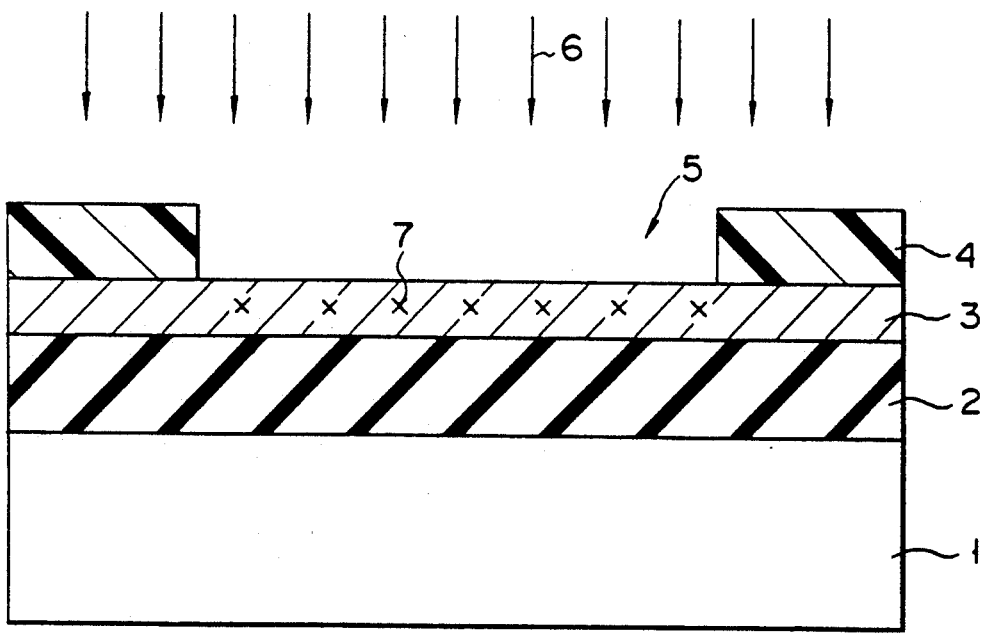

As shown in FIG. 3C, a photoresist 4 is removed from the rest of a semiconductor structure shown in FIG. 3B as in the case of the second embodiment and a photoresist 9 is coated on the whole surface of the resultant structure. A predetermined opening 10 is formed in the photoresist 9, by a photoetching method, at a location 7 of an aluminum film 3 which has been ion-implanted with an impurity 11. With the photoresist as a mask, the impurity 11 is selectively ion-implanted into the aluminum film 3 and a spot which has been ion-implanted with the impurity 11 is indicated by 12 in FIG. 3C.

For example, silicon is employed as the impurity 11.

With the photoresist removed as shown in FIG. 3D, a heat treatment step is conducted on the resultant structure. As a result, the impurities titanium and silicon are activated in the aluminum film 3 to selectively form an aluminum/titanium alloy film 8 and aluminum/silicon/titanium alloy film 14 in the aluminum film 3.

In this way, two kinds of impurities may be ion-implanted into the aluminum film 3 in overlapped fashion.

Embodiment 4

A method for forming a sputtered metal film according to a fourth embodiment of the present invention will be explained below with reference to FIGS. 4A to 4D.

FIGS. 4A to 4D are cross-sectional views showing the steps of forming a sputtered metal film over a semiconductor substrate. In FIGS. 4A to 4D, the same reference numerals are employed to designate a portion or a location corresponding to that shown in FIGS. 1A to 1C.

Figure 4A:
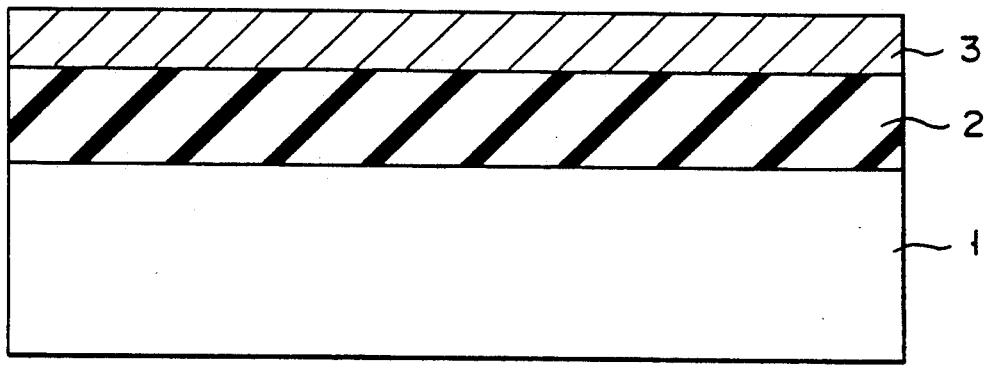
FIGS. 4A to 4D are cross-sectional views showing a fourth method for forming a sputtered metal film according to the present invention.

The step shown in FIG. 4A is the same as that shown in FIG. 1A and no further explanation is, therefore, omitted for brevity's sake.

Figure 4B:
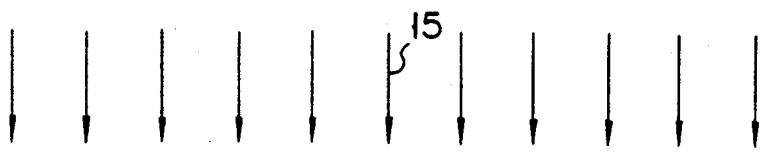
Figure 4B:
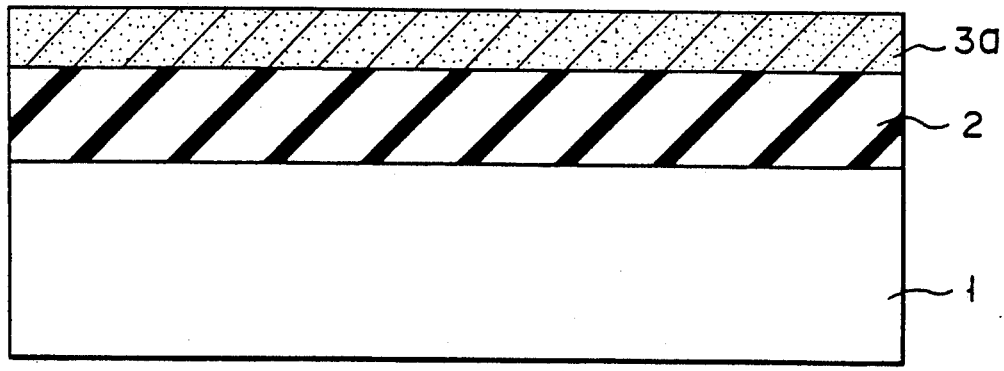

As shown in FIG. 4B, an impurity 15 is ion-implanted into an aluminum film 3, making the film an amorphous one as indicated by reference numeral 3a in FIG. 4B.

The impurity 15 is, for example, aluminum.

Figure 4C:
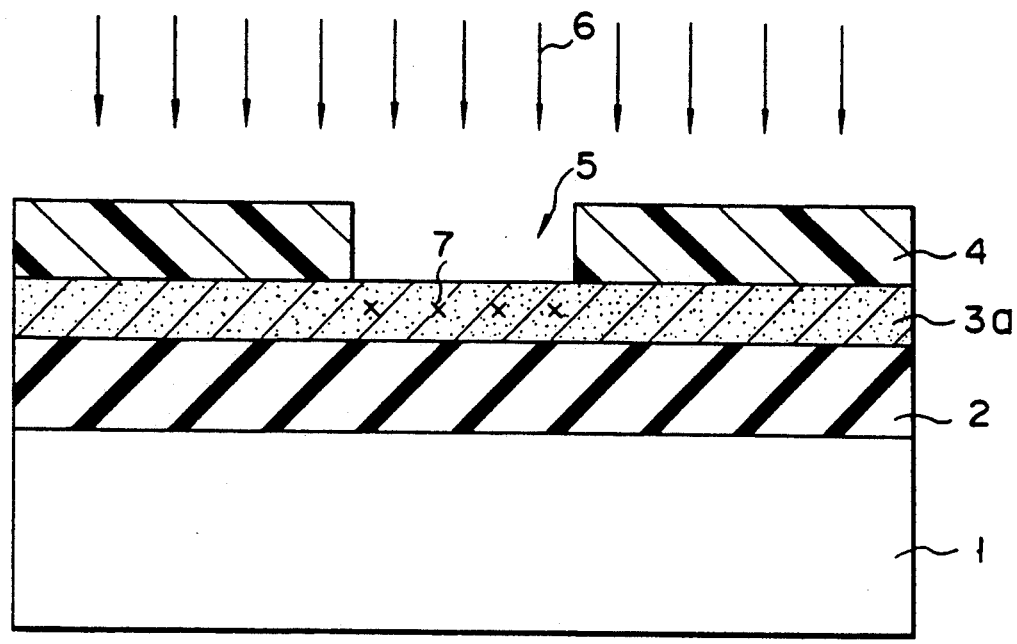

Then a photoresist 4 is coated on the surface of the resultant structure as shown in FIG. 4C. A predetermined opening 5 is formed in the photoresist 4 by a photoetching method and, with the photoresist as a mask, an impurity 6 is selectively ion-implanted in the amorphous aluminum film 3a and a site ion-implanted with the impurity 6 is indicated by reference numeral 7 in FIG. 4C.

The impurity 6 is, for example, titanium.

Figure 4D:
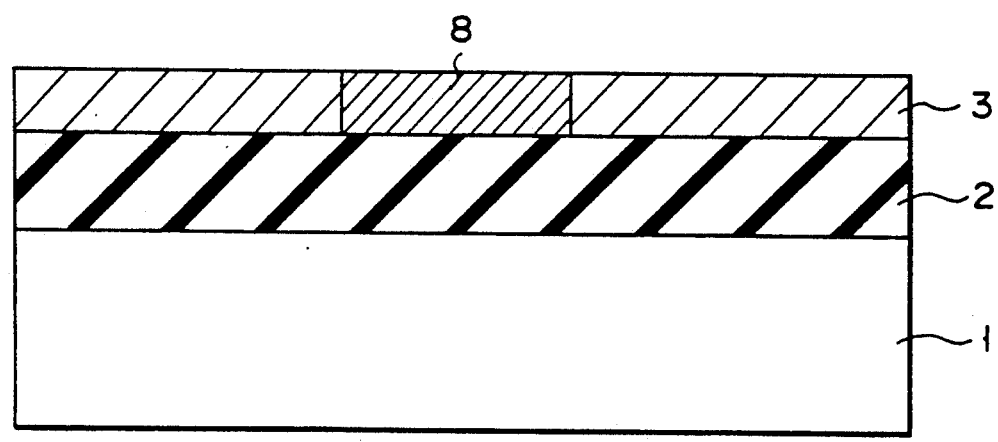

The photoresist 4 is removed from the rest of the resultant structure as shown in FIG. 4D and a heat treatment step is carried out, causing that implanted impurity such as titanium to be activated in the aluminum film 3 to selectively form an aluminum/titanium alloy in the aluminum film 3. A heat treatment step is conducted to make the amorphous aluminum film 3a in polycrystalline form.

This heat-treatment step is effected, for example, for 15 minutes at 450° C. to obtain the polycrystalline aluminum film 3a.

In this way, an impurity may, first, be ion-implanted in the whole aluminum film 3 to make the film amorphous and then another impurity is ion-implanted into the amorphous film 3a at a given location in overlapped fashion.

The amorphous aluminum film 3a is better to microfabricate than the polycrystalline aluminum film 3.

When a patterning, for example, is conducted, the polycrystalline aluminum film 3 is affected at the individual crystal orientation faces if a "very fine-width" design rule is used on a submicron or a half micron order for instance. However, the amorphous aluminum film 3a is not affected at the crystal orientation faces which would otherwise occur in the case of the polycrystalline aluminum film. This ensures an excellent microfabrication site.

Incidentally, a metal film, being locally ion-implanted with some or other material, will become an amorphous one at that local site. Even in the aforementioned embodiments 1 to 3, the ion-implanted site becomes an amorphous one, though being not explained in particular.

It is preferred that the ion-implanted site be made amorphous even in the fourth embodiment in order to achieve an enhanced microfabrication.

It is also preferred that, in order to make an ion-implanted site amorphous over the whole area and hence to achieve an enhances microfabrication, a sputtered metal film be ion-implanted with the same material as that of the sputtered metal film. It is preferable to prevent a variation in the property of the alloyed site by doing so.

Embodiment 5

A method for forming a connection wiring according to a fifth embodiment of the present invention will be explained below with reference to FIGS. 5A to 5J and 6A to 6J.

As shown in FIGS. 5A and 6A, for example, a field oxide film 102 is selectively formed by a LOCOS method on a surface area of a P type silicon substrate 100. An element area 104 is a site exposed on the surface of the silicon substrate 100.

As shown in FIGS. 5B and 6B, a gate oxidation film (later a gate oxide film 105) is formed on the whole surface of a resultant structure by, for example, a thermal oxidation method. Then a polysilicon layer is deposited by, for example, a CVD method on the whole surface of the resultant structure and doped with a material to provide a site of a given conductivity type. The site is diffused with, for example, phosphoryl chloride (POCl$_3$) to provide a site of n conductivity type. Then the resultant structure is patterned by a photoetching method to provide a pattern of a given gate electrode 106 as well as a pattern of a polysilicon wiring, not shown. With the gate electrode 106 and field oxide film 102 as a mask, an n type impurity such as arsenic (AS) is ion-implanted into the silicon substrate 100 to obtain n type semiconductor regions 108-1 to 108-3. The n type semiconductor regions 108-2 and 108-3 serve as drain and source regions, respectively.

Figure 5C:
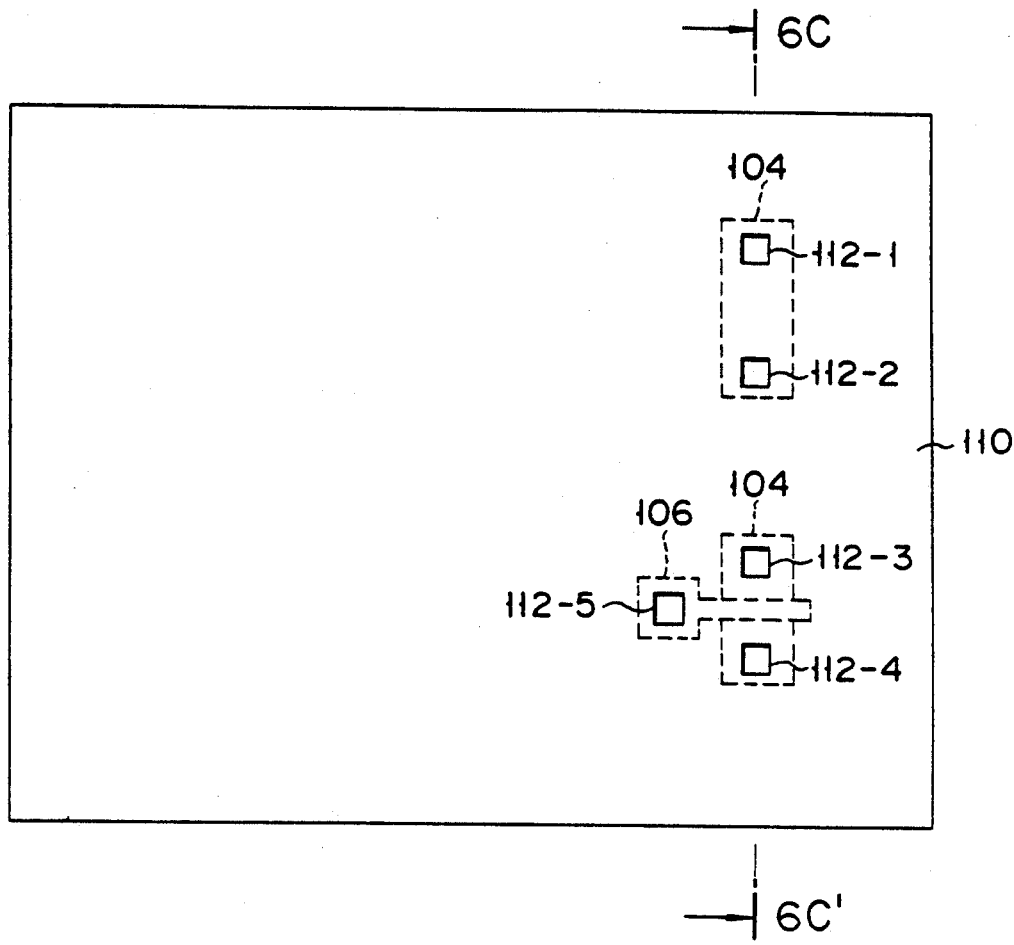
Figure 6C:
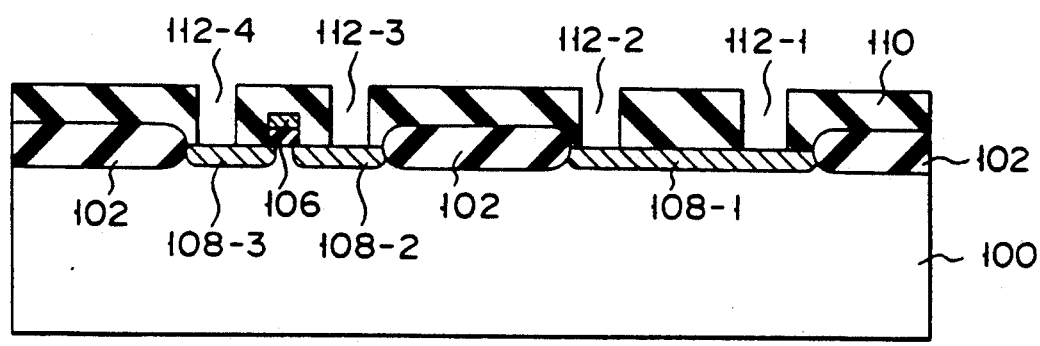

An insulating interlayer 110 such as a CVD-silicon oxide film is deposited, by a CVD method for instance, on the whole surface of the resultant structure as shown in FIGS. 5C and 6C. Then contact holes 112-1 to 112-5 are formed in the insulating interlayer 110 by the photoetching step to lead to a predetermined corresponding region.

An aluminum film 114 is formed by a sputtering method over the whole surface of the resultant structure as shown in FIGS. 5D and 6D.

In the sputtering step, it is desirable to use a high-purity aluminum sputtering target.

Then aluminum 116 is ion-implanted as a first impurity into the whole area of the aluminum film 114 as shown in FIGS. 5E and 6E to make that film at amorphous form. This amorphous aluminum film is identified by reference numeral 114a in FIGS. 5E and 6E.

Figure 5F:
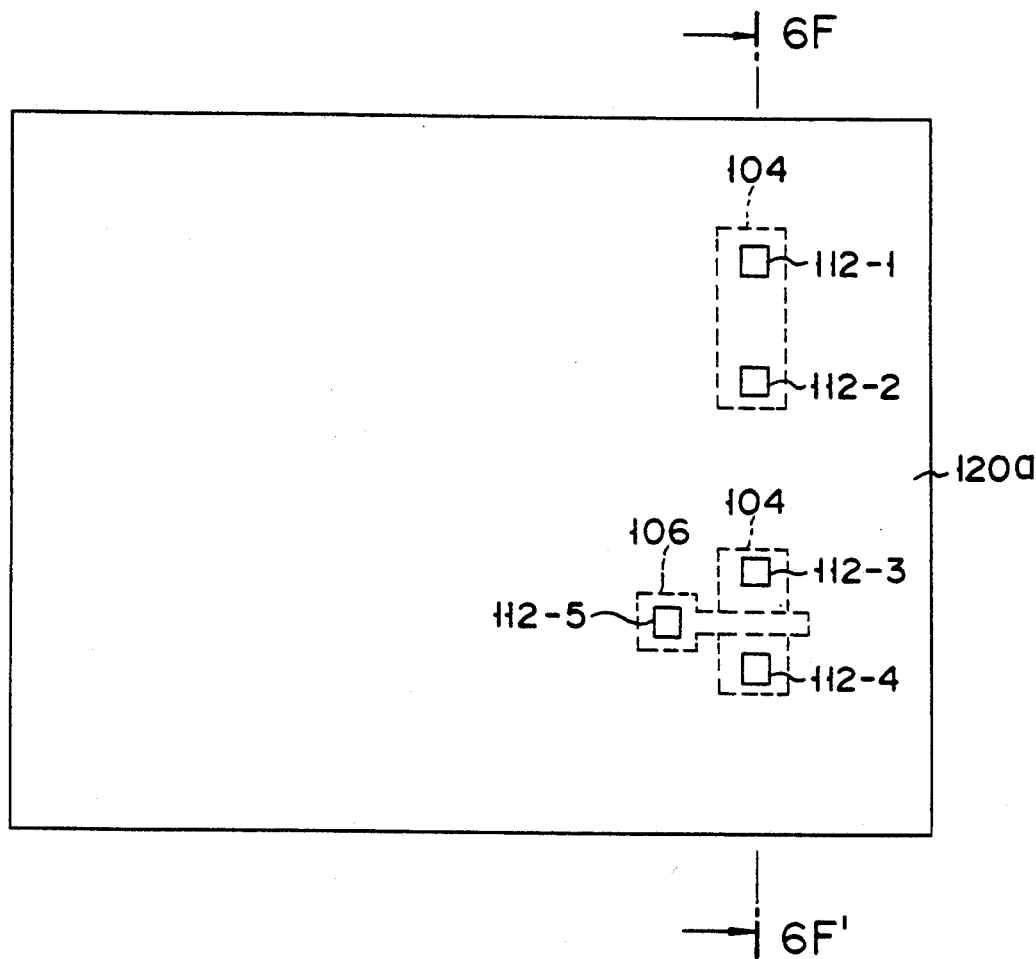
Figure 6F:
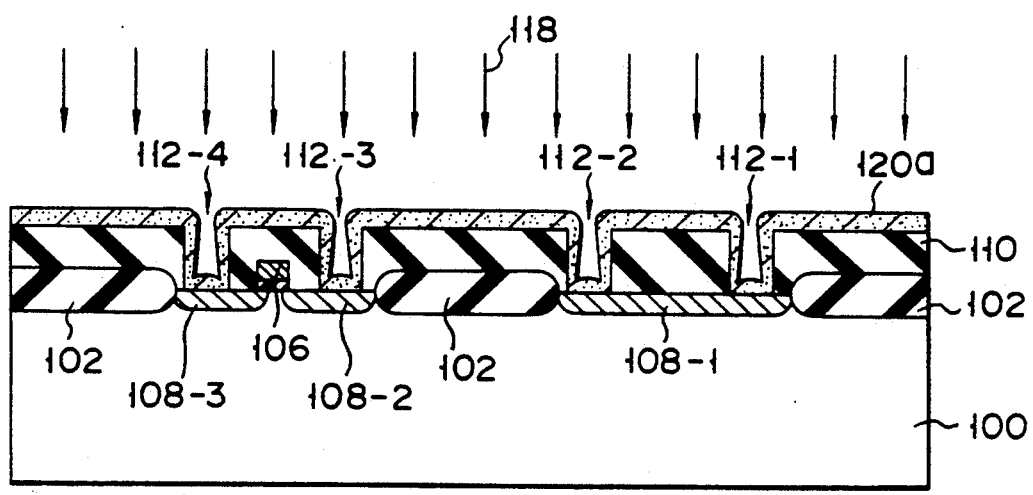

Then titanium 118 is ion-implanted as a second impurity into the whole surface area of the resultant structure as shown in FIGS. 5F and 6F to form the aluminum film 114a as an aluminum/titanium alloy film 120a.

Then a first photoresist 122 is coated on the whole surface of the resultant structure as shown in FIGS. 5G and 6G. An opening 123 is formed, by the photoetching method, in the photoresist 122 at a location corresponding to a pad area and its adjacent wiring area. With the photoresist 122 as a mask, titanium 118 is selectively ion-implanted via the opening 123 into an aluminum/titanium alloy film 120a to locally form an aluminum/titanium alloy film 124a rich in titanium content.

Figure 5H:
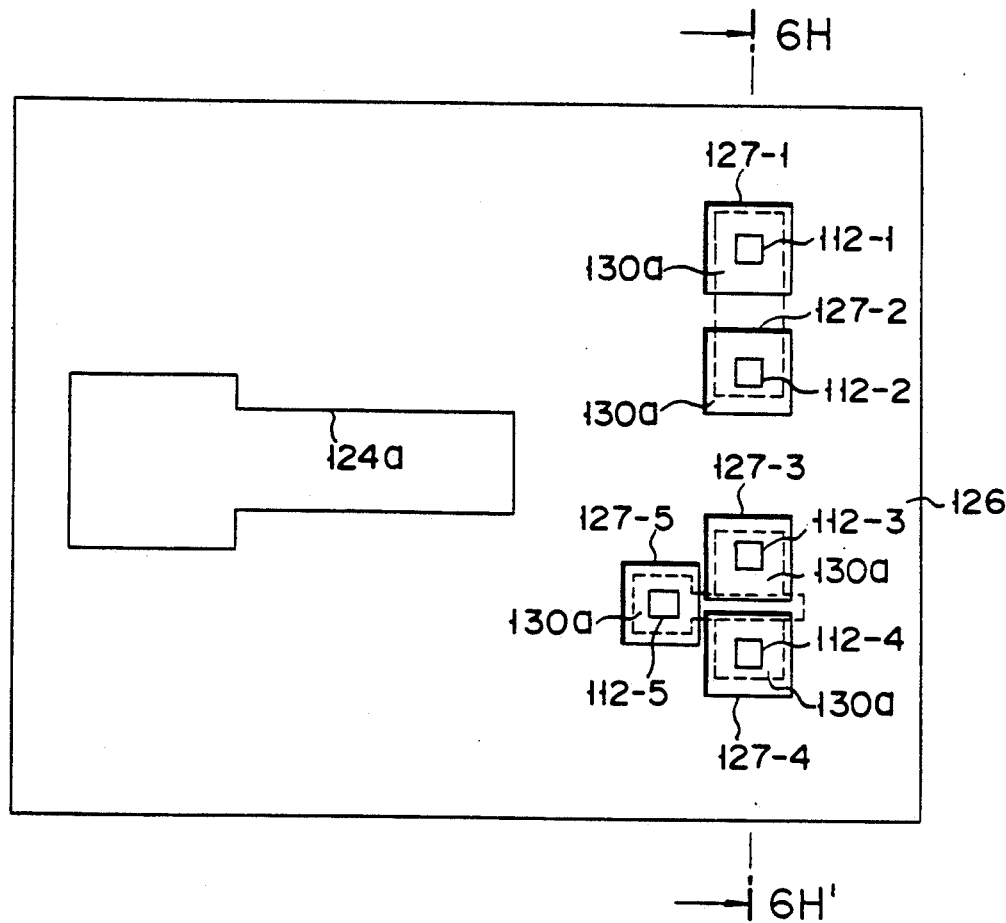
Figure 6H:
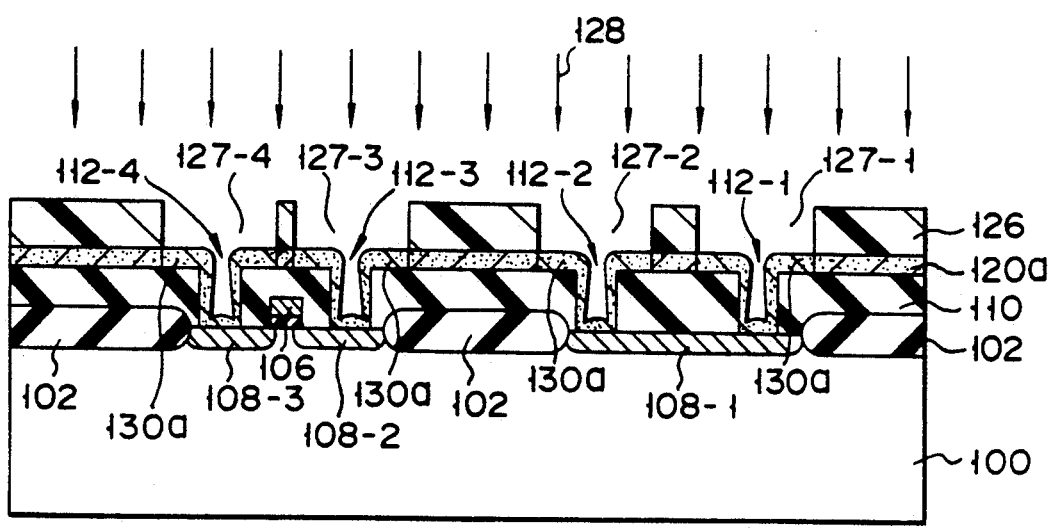

The first photoresist 122 is removed from the resultant structure as shown in FIG. 5H and 6H. Then a second photoresist 126 is coated over the whole surface of the structure. Then contact openings 127-1 to 127-5 are formed by the photoetching method in the photoresist 126 substantially at those locations corresponding to contact holes 112-1 to 112-5. With the photoresist 126 as a mask, a third impurity such as silicon 128 is selectively ion-implanted into the aluminum/titanium alloy film 120a via the openings 127-1 to 127-5 to locally form an aluminum/titanium/silicon alloy film 130a.

Figure 5I:
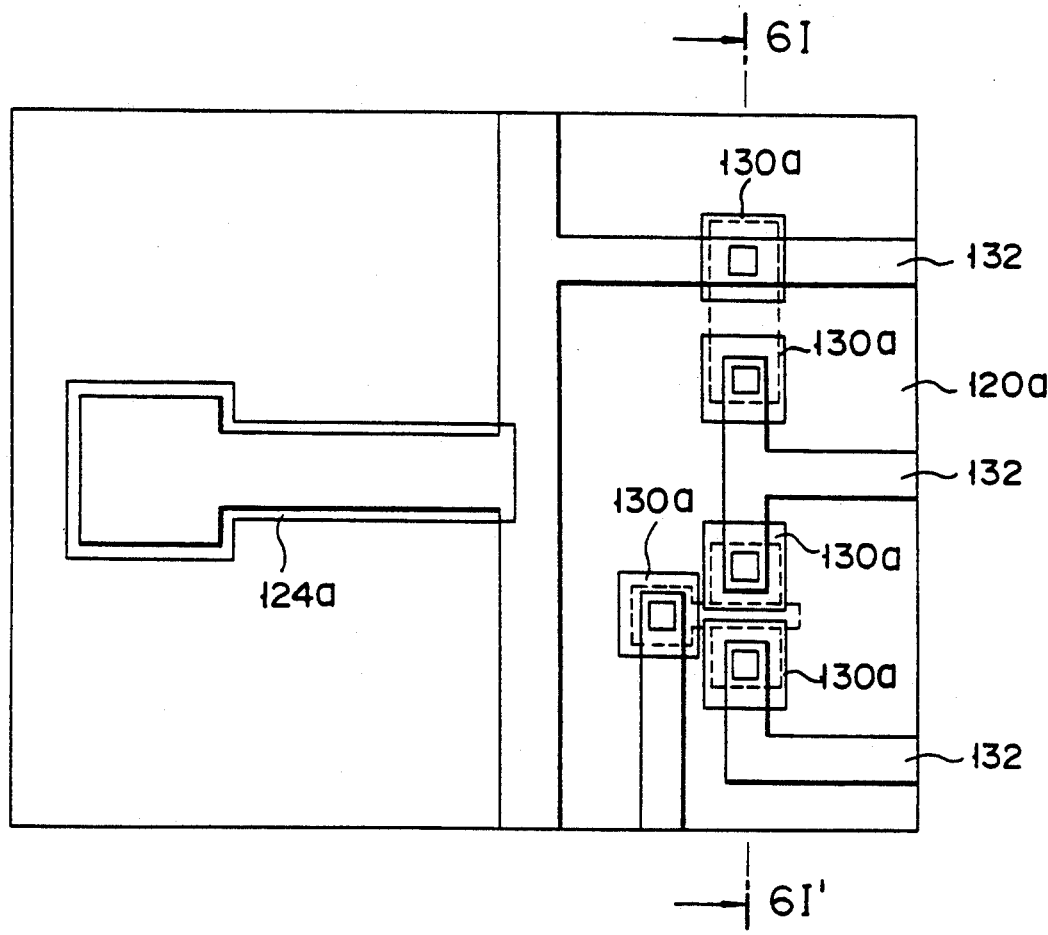
Figure 6I:
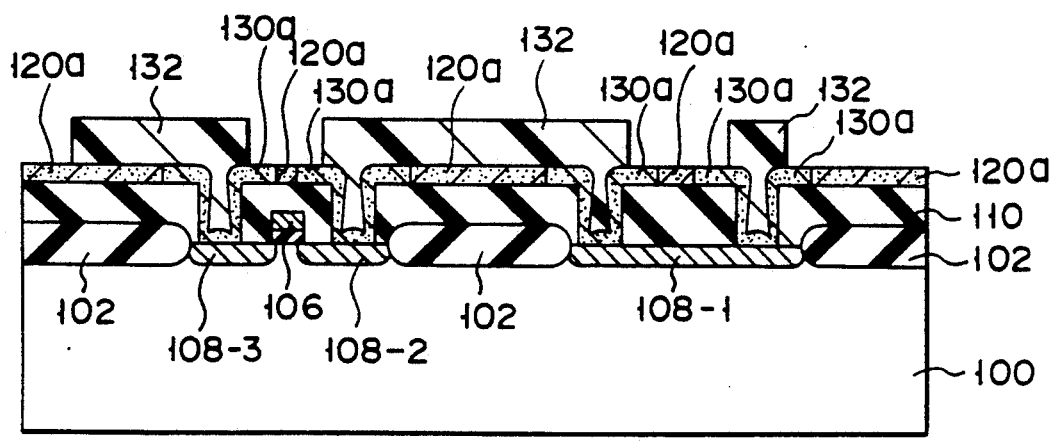

Then the second photoresist 126 is removed from the rest of the resultant structure as shown in FIGS. 5I and 6I. Then a third photoresist 132 is coated on the whole surface of the resultant structure and the photoresist 132 is patterned by the photoetching method to form a predetermined pattern.

With the third photoresist 132 as a mask, the aluminum/titanium alloy film 120a, titanium-rich aluminum/titanium alloy film 124a and aluminum/titanium/silicon alloy film 130a are selectively removed from the resultant structure and the third photoresist 132 is removed to form a pad 136 and a wiring 135 leading to a predetermined corresponding wire 134 and that pad. Then the resultant structure is heat treated, for example, for 15 minutes at 450° C. to make the amorphous aluminum film polycrystalline.

In this way, a wiring is completed according to the fifth embodiment of the present invention.

In the aforementioned method, aluminum 116 is ion-implanted into the aluminum film 114 at the step of FIGS. 5E and 6E to obtain the amorphous aluminum film 114a.

As a result, it is possible to wholly improve the microfabrication of the aluminum film 114 as formed by the sputtering method.

In the step shown in FIGS. 5F and 6F, the titanium is ion-implanted into the whole area of the aluminum film 114a to form an amorphous aluminum/titanium alloy film 120a.

According to the present invention, the amorphous aluminum film is made polycrystalline by the heat treatment shown, for example, at the step of FIGS. 5J and 6J. At this time, the titanium in the film is precipitated uniformly at its crystal boundaries, resulting in an increased resistance to an electromigration. Further, since the titanium is not precipitated at crystal form, the resultant film reveals an increased mechanical strength as well as an increased resistance to a breakage of the wire caused by a stress involved.

In the step shown in FIGS. 5G and 6G, the titanium 118 is selectively ion-implanted into the amorphous aluminum/titanium alloy film 120a to provide an Ti-rich aluminum/titanium alloy film (amorhpous) 124a.

According to the present invention, it is possible to additively ion-implant another impurity in proper way. If titanium is additionally ion-implanted selectively into a site of a very high current density, such as the pad or its adjacent wiring in particular, it is possible to achieve a wiring of high reliability.

As shown in FIGS. 5H and 6H, the silicon 128 is selectively ion-implanted substantially at the site corresponding to the contact holes 112-1 to 112-5, providing an aluminum/titanium/silicon alloy film (amorphous) 130a. This arrangement prevents an "aluminum spike" which might otherwise be involved in a resultant structure.

The silicon 128 is locally ion-implanted at that site substantially corresponding to the contact holes 112-1 to 112-5, thereby preventing an increase in resistance of the resultant film of interest.

By the aforementioned heat treatment as set forth in connection with FIGS. 5J and 6J, the aluminum/titanium/silicon alloy film is flowed into the contact holes 112-1 to 112-5 to allow it to be filled there. It is thus possible to improve a step coverage at and near the filled area and at the other area and to prevent a breakage of the metal wire layer at the contact holes 112-1 to 112-5.

Although, in the aforementioned embodiments, the impurities titanium, silicon and aluminum have been explained as being used as the implanting ones, other proper impurities may be used as ion species as will be set forth below.

For example, the ion species may be selected from copper, tungsten, molybdenum, palladium, magnesium, cobalt, nickel, hafnium, platinum, gold etc. Although the fifth embodiments is explained in conjunction with the NMOS type, it is also possible to use a CMOS-, Bipolar- and bipolar CMOS type device instead.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims.

What is claimed is:

1. A method for alloying a sputtered metal film used in a semiconductor device comprising the steps of:
   (a) forming a sputtered metal film over a major surface of a semiconductor substrate, said sputtered film substantially comprising first metal atoms of a first type;
   (b) forming a first mask having at least one window, before said sputtered film is patterned, on said sputtered film;
   (c) implanting using said first mask a first impurity including second metal atoms of a second type different from said first type into said sputtered film, thereby retaining at least said second metal atoms in said sputtered film;
   (d) removing said first mask and forming a second mask having at least one window on said sputtered film;
   (e) implanting using said second mask a second impurity including third metal atoms of a third type different from said first and second types into said sputtered film, thereby retaining at least said third metal atoms in said sputtered film; and
   (f) forming a first alloy area in which at least said first metal atoms and said second metal atoms are mixed and a second alloy area in which at least said first metal atoms and said third metal atoms are mixed.

2. The manufacturing method according to claim 1, wherein said first and second alloy areas are formed by subjecting said sputtered film to a heat treatment.

3. The manufacturing method according to claim 2, wherein said first metal atoms are aluminum.

4. The manufacturing method according to claim 3, wherein said second metal atoms are selected from an element group consisting of titanium, silicon, copper, tungsten, molybdenum, palladium, magnesium, cobalt, nickel, hafnium, platinum, and gold and wherein said third metal atoms are selected from elements, except one selected as said second metal atoms, of said element group.

5. A method for alloying a sputtered metal film used in a semiconductor device comprising the steps of:
   (a) forming a sputtered metal film over a major surface of a semiconductor substrate, said sputtered film substantially comprising first metal atoms of a first type;
   (b) forming a first mask having at least one window, before said sputtered film is patterned on said sputtered film;
   (c) implanting using said first mask a first impurity including second metal atoms of a second type different from said first type into said sputtered film, thereby retaining at least said second metal atoms in said sputtered film;
   (d) removing said first mask and forming a second mask having at least one window on said sputtered film, an area into which said first impurity is implanted being exposed from the window of said second mask;
   (e) implanting using said second mask a second impurity including third metal atoms of a third type different from said first and second types into said sputtered, film thereby retaining at least said third metal atoms in said sputtered metal film; and
   (f) forming both a first alloy area in which at least said first metal atoms and said second metal atoms are mixed and a second alloy area in which at least said first metal atoms, said second metal atoms, and said third metal atoms are mixed.

6. The manufacturing method according to claim 5, wherein said first and second alloy areas are formed by subjecting said sputtered film to a heat treatment.

7. The manufacturing method according to claim 6, wherein said first metal atoms are aluminum.

8. The manufacturing method according to claim 7, wherein said second metal atoms are selected from an element group consisting of titanium, silicon, copper, tungsten, molybdenum, palladium, magnesium, cobalt, nickel, hafnium, platinum and gold, and wherein said third metal atoms are selected from said elements, except one selected for said second metal atoms, of said element group.

9. A method for alloying a sputtered metal film used in a semiconductor device comprising the steps of:
   (a) forming a sputtered metal film over a major surface of a semiconductor substrate, said sputtered film substantially comprising first metal atoms of a first type;
   (b) implanting a first impurity including second metal atoms of a second type into said sputtered film, thereby retaining at least said second metal atoms in said sputtered film, before said sputtered metal film is patterned;
   (c) forming a first mask having at least one said window on said sputtered film;
   (d) implanting using said first mask a second impurity including third metal atoms of a third type into said sputtered film, thereby retaining at least said third metal atoms in sputtered film;
   (e) removing said first mask and forming a second mask having at least one window on said sputtered film;
   (f) implanting using said second mask a third impurity including fourth metal atoms of a fourth type different from said first, second, and third types into said sputtered film, thereby retaining at least said fourth metal atoms in said sputtered film; and (g) forming a first alloy area in which at least said first metal atoms, said second metal atoms, and said third metal atoms are mixed and a second alloy area in which at least said first metal atoms, said second metal atoms, and said fourth metal atoms are mixed.

10. The manufacturing method according to claim 9, wherein said first and second alloy areas are formed by subjecting said sputtered film to a heat treatment.

11. A manufacturing method according to claim 10, wherein said first metal atoms are aluminum.

12. A manufacturing method according to claim 11, wherein said second metal atoms are selected from an element group consisting of titanium, silicon, copper, tungsten, molybdenum, palladium, magnesium, cobalt, nickel, hafnium, platinum, and gold.

13. A manufacturing method according to claim 12, wherein said third metal atoms are selected from an element group consisting of titanium, silicon, copper, tungsten, molybdenum, palladium, magnesium, cobalt, nickel, hafnium, platinum, and gold, and wherein said fourth metal atoms are selected from said elements, except one selected for said third metal atoms, of said element group.

14. A method for alloying a sputtered metal film used in a semiconductor device comprising the steps of:
(a) forming a sputtered metal film over a major surface of a semiconductor substrate, said sputtered film substantially comprising first metal atoms of a first type;
(b) implanting a first impurity including second metal atoms of a second type into said sputtered film, thereby making said sputtered film an amorphous state, before said sputtered metal film is patterned;
(c) forming a first mask having at least one window on said sputtered film;
(d) implanting using said first mask a second impurity including third metal atoms of a third type into said sputtered film, thereby retaining at least said third metal atoms in said sputtered film;
(e) removing said first mask and forming a second mask having at least one window on said sputtered film;
(f) implanting using said second mask a third impurity including fourth metal atoms of a fourth type different from said first, said second, and said third types into said sputtered film, thereby retaining at least said fourth metal atoms in said sputtered film; and
(g) forming a first alloy area in which at least said first, said second, and said third metal atoms are mixed, and a second alloy area in which at least said first, said second, said third, and said fourth metal atoms are mixed.

15. The manufacturing method according to claim 10, wherein said first and second alloy areas are formed by subjecting said sputtered film to a heat treatment.

16. The manufacturing method according to claim 15, wherein said first metal atoms are aluminum.

17. The manufacturing method according to claim 16, wherein said second metal atoms are aluminum.

18. The manufacturing method according to claim 17, wherein said third metal atoms are selected from an element group consisting of titanium, silicon, copper, tungsten, molybdenum, palladium, magnesium, cobalt, nickel, hafnium, platinum, and gold, and wherein said fourth metal atoms are selected from elements, except one selected for said third metal atoms, of said element group.

* * * * *